(12) United States Patent
Chen (10) Patent No.: US 11,502,233 B2
(45) Date of Patent: Nov. 15, 2022

(54) ELECTRONIC DEVICE

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 120 days.

(21) Appl. No.: 17/132,719

(22) Filed: Dec. 23, 2020

(65) Prior Publication Data

US 2021/0202814 A1 Jul. 1, 2021

(30) Foreign Application Priority Data

Dec. 25, 2019 (TW) ................................. 108147652

(51) Int. Cl.
*H01L 33/62* (2010.01)
*H01L 23/00* (2006.01)
*H01L 25/075* (2006.01)

(52) U.S. Cl.
CPC .............. *H01L 33/62* (2013.01); *H01L 24/16* (2013.01); *H01L 25/0753* (2013.01); *H01L 2224/16227* (2013.01); *H01L 2224/16502* (2013.01); *H01L 2224/83805* (2013.01); *H01L 2924/01028* (2013.01); *H01L 2924/01049* (2013.01); *H01L 2924/01079* (2013.01); *H01L 2924/01322* (2013.01); *H01L 2933/0066* (2013.01)

(58) Field of Classification Search
CPC ..... H01L 33/62; H01L 24/16; H01L 25/0753; H01L 2224/16227; H01L 2224/16502; H01L 2224/83805; H01L 2924/01028; H01L 2924/01049; H01L 2924/01079; H01L 2924/01322; H01L 2933/0066
See application file for complete search history.

(56) References Cited

U.S. PATENT DOCUMENTS

| 2006/0097354 A1* | 5/2006 | Ogihara | B41J 2/45 |
| | | | 257/E21.505 |
| 2015/0349217 A1* | 12/2015 | Sun | H01L 33/62 |
| | | | 438/126 |
| 2017/0365588 A1* | 12/2017 | Chen | H01L 33/62 |
| 2018/0166429 A1* | 6/2018 | Chong | H01L 33/0093 |
| 2020/0126963 A1* | 4/2020 | Lee | H01L 33/0093 |
| 2020/0321390 A1* | 10/2020 | Wu | H01L 33/50 |

* cited by examiner

Primary Examiner — Benjamin Tzu-Hung Liu
(74) Attorney, Agent, or Firm — Muncy, Geissler, Olds & Lowe, P.C.

(57) ABSTRACT

An electronic device comprises a target substrate, a micro semiconductor structure array, a conductor array, and a connection layer. The micro semiconductor structure array is disposed on the target substrate. The conductor array corresponds to the micro semiconductor structure array, and electrically connects the micro semiconductor structure array to a pattern circuit of the target substrate. The conductors of the conductor array are independent from one another. Each conductor is an integrated member formed by eutectic bonding a conductive pad of the target substrate and a conductive electrode of the corresponding one of the micro semiconductor structures of the micro semiconductor structure array. The connection layer connects the micro semiconductor structures to the target substrate. The connection layer excludes a conductive material. The connection layer contacts and surrounds the conductors, so that the connection layer and the conductors together form a one-layer structure.

6 Claims, 6 Drawing Sheets

ELECTRONIC DEVICE

CROSS REFERENCE TO RELATED APPLICATIONS

This Non-provisional application claims priority under 35 U.S.C. § 119(a) on Patent Application No(s). 108147652 filed in Taiwan, Republic of China on Dec. 25, 2019, the entire contents of which are hereby incorporated by reference.

BACKGROUND

Technology Field

The present disclosure relates to an electronic device and, in particular, to an electronic device and a manufacturing method thereof that utilize the eutectic bonding of micro semiconductor structures.

Description of Related Art

In the manufacturing of the conventional photoelectric device, the conventional light-emitting diodes (LED), which have the side lengths greater than 150 μm, are fabricated in advance by many processes including epitaxy, photolithography, metal plating, etching, and cutting, thereby obtain individual LED dies. Afterwards, the electrode of the LED die is electrically connected to the circuit substrate by wire bonding or eutectic bonding. Regarding the micro light-emitting diodes (μLED), due to the dimension of the μLED is very small (e.g. only 25 μm or less), the conventional wire bonding or eutectic bonding machine cannot be used to form the electric connection for the electrodes of μLEDs.

Therefore, it is desired to provide a proper solution for forming the electrical connection for the electrodes of the micron-scaled or smaller μLEDs or micro semiconductor structures.

SUMMARY

This disclosure provides an electronic device and a manufacturing method thereof that can be widely applied to the electronic devices with different micro semiconductor structures.

This disclosure also provides an electronic device and a manufacturing method thereof that can provide a solution for the electrical connection requirement of the micron-scaled or smaller micro semiconductor structures.

An electronic device of this disclosure comprises a target substrate, a micro semiconductor structure array, a conductor array, and a connection layer. The micro semiconductor structure array comprises a plurality of micro semiconductor structures arranged in an array, and the micro semiconductor structures are disposed on the target substrate. The conductor array comprises a plurality of conductors arranged in an array, and the conductors are disposed corresponding to the micro semiconductor structures and electrically connecting the micro semiconductor structures to a pattern circuit of the target substrate. The conductors are independent and individual to one another. Each of the conductors is an integrated member formed by eutectic bonding a conductive pad of the target substrate and a conductive electrode of a corresponding one of the micro semiconductor structures. Each of the conductors comprises a first end connecting to the corresponding micro semiconductor structure, a second end connecting to the target substrate, and a peripheral portion connecting to the first end and the second end. The connection layer connects the micro semiconductor structures to the target substrate. The connection layer is nonconductive, and the connection layer contacts and surrounds the peripheral portion of each of the conductors. The connection layer and the conductors together form a one-layer structure.

In one embodiment, each of the conductors is formed by a eutectic bonding of an In—Au alloy system.

In one embodiment, each of the conductors is formed by a eutectic bonding of an In—Ni alloy system.

In one embodiment, a polymer material of the connection layer comprises an epoxy material, or an acrylic material.

In one embodiment, a polymer material of the connection layer has a solidification temperature of 170-220° C.

In one embodiment, a polymer material of the connection layer has a glass transition temperature greater than 240° C.

A manufacturing method of an electronic device of this disclosure comprises: coating a polymer material to a preparation thickness on a target substrate having a conductive pad; picking up micro semiconductor structures in array, which have a conductive electrode, from the polymer material coated on the target substrate; and eutectic bonding the conductive electrode and the corresponding conductive pad.

In one embodiment, the conductive pad comprises a first metal, and the polymer material is nonconductive. The polymer material is defined with a viscosity-temperature variation characteristic, wherein the polymer material has a first viscosity at a first temperature, a second viscosity at a second temperature, a third viscosity at a third temperature, a fourth viscosity at a fourth temperature, and a fifth viscosity at a fifth temperature. The first to fifth temperatures are increased sequentially, wherein the first temperature is a room temperature, and the fifth temperature is a glass transition temperature. The third viscosity and the fifth viscosity are threshold values, wherein the third viscosity is a minimum threshold value, and the fifth viscosity is a maximum threshold value. The second viscosity is close to the third viscosity.

In one embodiment, the conductive electrode comprises a second metal and is disposed on the corresponding micro semiconductor structure, and the conductive electrode disposed on the corresponding micro semiconductor structure corresponds to the conductive pad disposed on the target substrate. The first metal and the second metal have a eutectic temperature, and the eutectic temperature is between the third temperature and the fourth temperature.

In one embodiment, the manufacturing method comprises: heating the micro semiconductor structures, the polymer material, and the target substrate from the first temperature to the fourth temperature, while further performing the following steps of:

starting from the second temperature to approach the micro semiconductor structures and the target substrate to each other by a first pressure, thereby applying the first pressure to the micro semiconductor structures and/or the target substrate; and starting from the eutectic temperature to press the micro semiconductor structures and the target substrate to each other by a second pressure, thereby applying the second pressure to the micro semiconductor structures and/or the target substrate so as to generate eutectic bonding between the first metal of the conductive pad and the second metal of the conductive electrode.

In one embodiment, in the step of coating the polymer material to the preparation thickness on the target substrate, the second temperature is relatively lower than the third temperature by 10° C.

In one embodiment, in the step of coating the polymer material to the preparation thickness on the target substrate, the fourth temperature is relatively higher than the third temperature by 90-100° C.

In one embodiment, in the step of coating the polymer material to the preparation thickness on the target substrate, the fourth temperature is relatively higher than the eutectic temperature by 10-40° C.

In one embodiment, the first metal and the second metal are indium and gold, and vice versa.

In one embodiment, the first metal and the second metal are indium and nickel, and vice versa.

In one embodiment, in the step of coating the polymer material to the preparation thickness on the target substrate, the eutectic temperature is 160° C.

In one embodiment, in the step of coating the polymer material to the preparation thickness on the target substrate, the polymer material comprise an epoxy material or an acrylic material.

In one embodiment, in the step of coating the polymer material to the preparation thickness on the target substrate, the fifth temperature (the glass transition temperature) is greater than 240° C.

In one embodiment, in the step of coating the polymer material to the preparation thickness on the target substrate, the preparation thickness is 2-7 μm.

In one embodiment, in the step of coating the polymer material to the preparation thickness on the target substrate, the second temperature is 70-110° C.

In one embodiment, in the step of coating the polymer material to the preparation thickness on the target substrate, the second temperature is 90° C.

In one embodiment, in the step of coating the polymer material to the preparation thickness on the target substrate, the third temperature is 80-120° C.

In one embodiment, in the step of coating the polymer material to the preparation thickness on the target substrate, the fourth temperature is 170-220° C.

In one embodiment, in the step of eutectic bonding, the first pressure is between 1 MPa and 10 MPa, and lasts for 2-40 seconds.

In one embodiment, in the step of eutectic bonding, the second pressure is between 0.5 MPa and 50 MPa, and lasts for 5-60 seconds.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

In this disclosure, the "electronic device" comprising "a semiconductor structure array" can be, for example but not limited to, a display panel, a multimedia board, a sensing device, a semiconductor device, or a lighting device, etc. In the following, the term "micro" of the micro semiconductor structures generally refers to micron-scale semiconductor structures. In the following, the "semiconductor structures" comprise, for example but not limited to, high-quality monocrystalline semiconductors and polycrystalline semiconductors, semiconductor materials fabricated by high temperature processing, doped semiconductor materials, organic and inorganic semiconductors, and combinations of semiconductor materials and structures having one or more additional semiconductor components or non-semiconductor components (such as dielectric layers or materials, or conductive layers or materials). Semiconductor structures include, for example but are not limited to, transistors, photovoltaic devices including solar cells, diodes, light-emitting diodes, laser diodes, p-n junction diodes, photodiodes, integrated circuits, and sensors, and any assembly containing any of the above-mentioned semiconductor elements.

In the following, the term "target substrate" refers to a non-native substrate for receiving the micro semiconductor structures. The material of the native substrate or non-native substrate includes, for example but not limited to, polymers, plastics, resins, polyimide, polyethylene naphthalate, polyethylene terephthalate, metal, foil, glass, quartz, glass fibers, flexible glass, semiconductor, sapphire, metal-glass fiber composite board, metal-ceramic composite board, or the likes.

In the following, the term "pick up" refers to pick up at least a part of at least one row of micro semiconductor structures, and the amount and range of the picked micro semiconductor structures can be determined based on the design and requirement for the target substrate.

In the following, the term "array" or "in an array" means the arrangement of a row, a column, or a matrix with rows and columns, or to regularly arrange in a polygon or irregular shape, and this disclosure is not limited.

Figure 1:
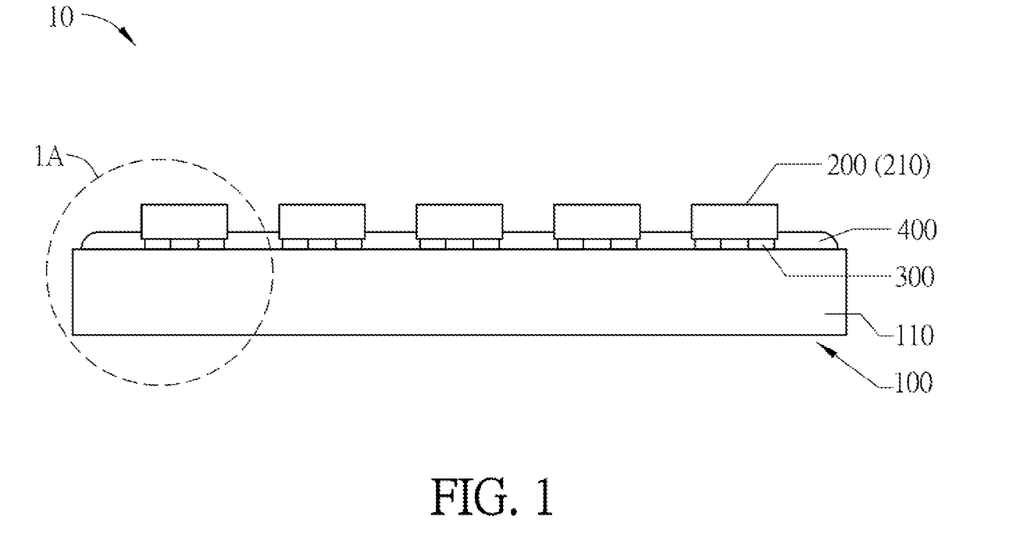
FIG. 1 is a schematic diagram showing an electronic device of this disclosure.
Figure 1A:
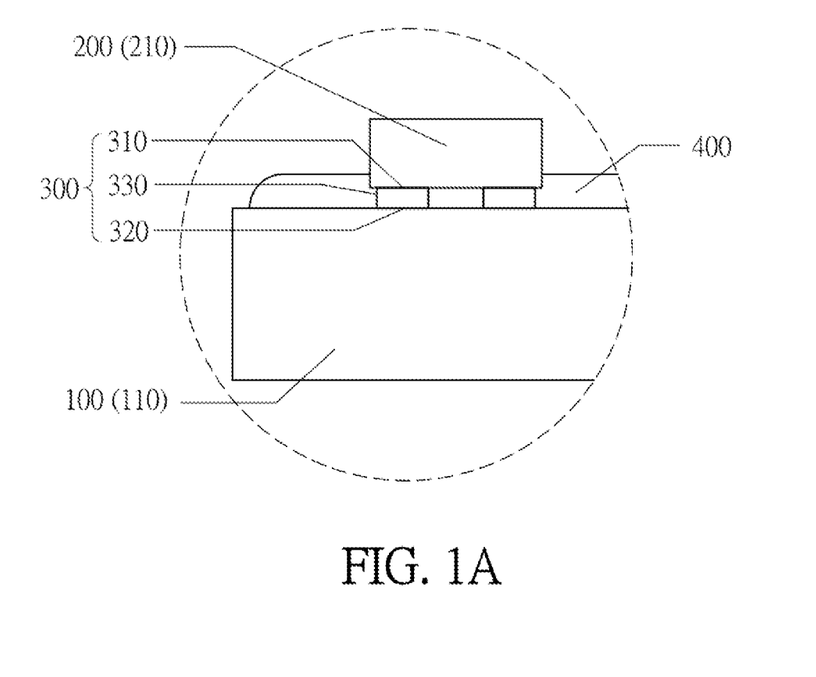
FIG. 1A is a partial enlarged view of FIG. 1.
Figure 3A:
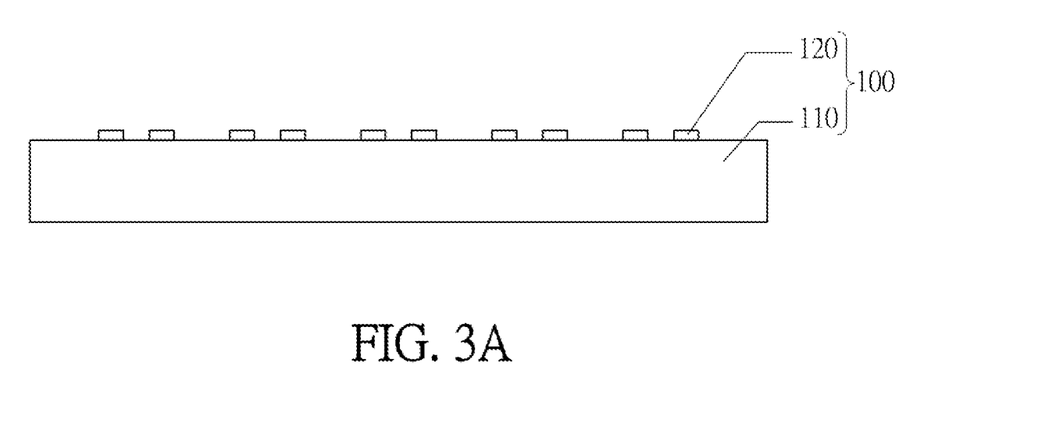
FIGS. 3A to 3E are schematic diagrams showing the manufacturing procedure of an embodiment corresponding to the manufacturing method of an electronic device as shown in FIG. 2.

FIG. 1 is a schematic diagram showing an electronic device 10 of this disclosure. Referring to FIG. 1, the electronic device 10 comprises a target substrate 100, a plurality of micro semiconductor structures 200 arranged in an array, a plurality of conductors 300 arranged in an array, and a connection layer 400. With reference to FIG. 3A, the target substrate 100 comprises a substrate 110, and a pattern circuit (not shown) is formed on the substrate and is designed based on the requirement of the electronic device 10. A plurality of conductive pads are formed on the pattern circuit. Referring to FIG. 1 again, the micro semiconductor structures 200 are disposed on the target substrate 100 and positioned corresponding to the pattern circuit of the target substrate 100. Each micro semiconductor structure 200 comprises a main body 210. The conductors 300 are disposed corresponding to the micro semiconductor structures 200 and electrically connecting the micro semiconductor structures 200 to the pattern circuit of the target substrate 100. The conductors 300 are independent to one another. With reference to FIG. 3E, each conductor 300 is an integrated member formed by eutectic bonding one of the conductive pads of the target substrate 100 and a conductive electrode of the corresponding micro semiconductor structure 200. As shown in FIG. 1A, each conductor 300 comprises a first end 310 connecting to the corresponding micro semiconductor structure 200, a second end 320 connecting to the target substrate 100, and a peripheral portion 330 connecting to the first end 310 and the second end 320. The connection layer 400 connects the micro semiconductor structures 200 to the target substrate 100. In this embodiment, the connection layer 400 is nonconductive; for further description, the connection layer 400 excludes any conductive material, such as a polymer material without containing the conductive particles. The connection layer 400 contacts and surrounds the peripheral portion 330 of each of the conductors 300, so that the connection layer 400 and the conductors 300 arranged in an array together form a one-layer structure. For further interpretation, the conductors 300 are accommodated in the connection layer 400. Herein, the connection layer 400 is formed by solidifying a polymer material after a specific process (referring to FIGS. 3D to 3E). Similar to each connector 300, the connection layer is configured to connect the micro semiconductor structures 200 (the main body 210) to the target substrate 100 (or the pattern circuit thereof).

Figure 2:
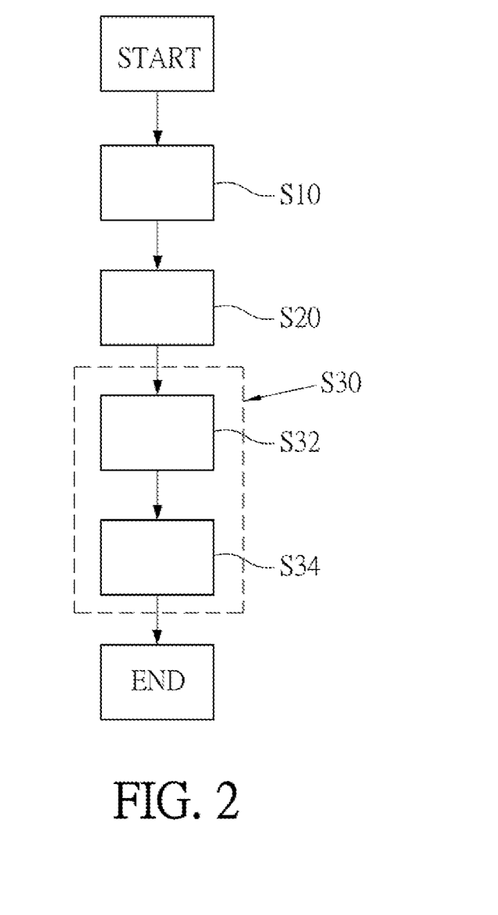
FIG. 2 is a flow chart of a manufacturing method of an electronic device of this disclosure.

FIG. 2 is a flow chart of a manufacturing method of the electronic device 10 according to an embodiment of this disclosure, and FIGS. 3A to 3E are schematic diagrams showing the manufacturing procedure of FIG. 2.

As shown in FIG. 2A, the manufacturing method of the electronic device 10 comprises the following steps S10, S20 and S30.

Figure 3B:
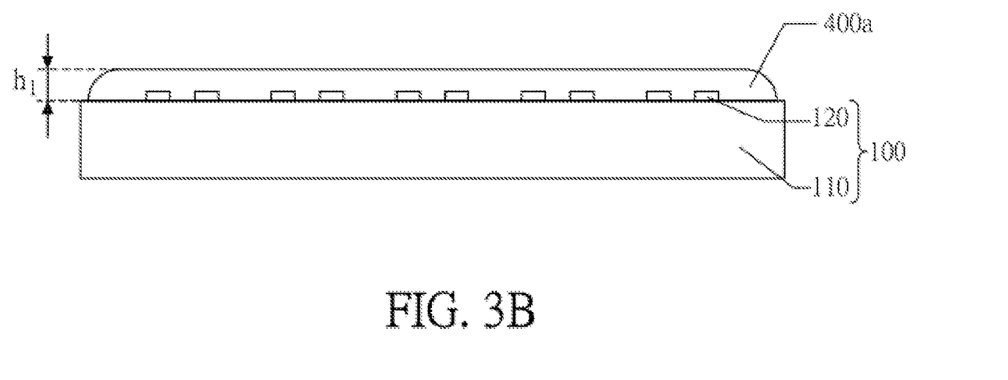

As shown in FIG. 3B, the step S10 is to coat a polymer material 400a to a preparation thickness h1 on a target substrate 100. Referring to FIG. 3A, besides the substrate 110, the target substrate 100 further comprises a pattern circuit and a conductive pad 120. The pattern circuit is disposed on the substrate 110. The conductive pad 120 is disposed on the pattern circuit and comprises a first metal.

In this embodiment, the polymer material 400a can be a curable material without containing any conductive particles, such as, for example but not limited to, an epoxy material or an acrylic material. Herein, different from the conventional anisotropic conductive film (ACF), the polymer material 400a does not contain the conductive particles or conductive balls, which are distributed in the adhesive and have high cost, and can be widely applied to different electronic devices comprising micro semiconductor structures with the following steps. Obviously, this embodiment utilizing the polymer material 400a has the advantage of low cost.

Figure 4A:
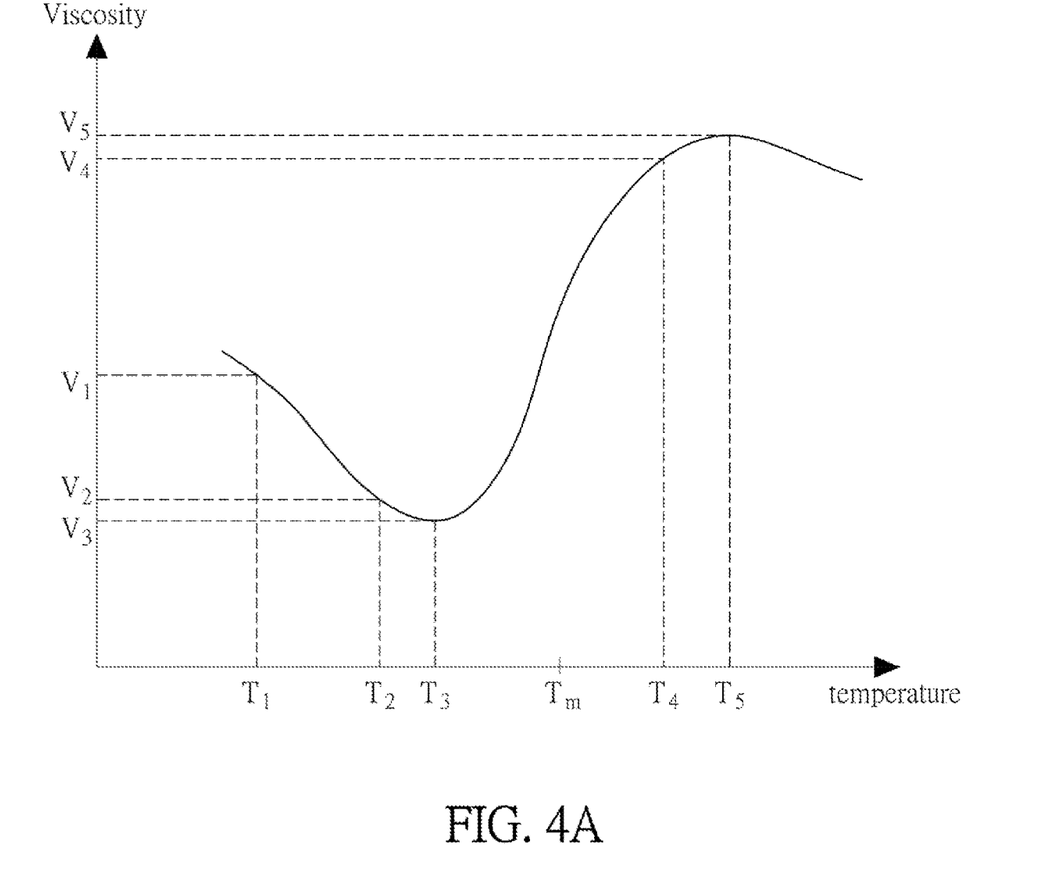
FIG. 4A is a schematic graph showing the viscosity-temperature variation characteristic of the polymer material of this disclosure.

With reference to FIG. 4A, the polymer material 400a is defined with a viscosity-temperature variation characteristic. In this embodiment, the polymer material 400a has a first viscosity $V_1$ at a first temperature $T_1$, a second viscosity $V_2$ at a second temperature $T_2$, a third viscosity $V_3$ at a third temperature $T_3$, a fourth viscosity $V_4$ at a fourth temperature $T_4$, and a fifth viscosity $V_5$ at a fifth temperature $T_5$. As shown in FIG. 4A, the first temperature $T_1$ to the fifth temperature $T_5$ are increased sequentially, wherein the first temperature $T_1$ is a room temperature, which is generally 25° C.-30° C. The solidification (curing) of the polymer material can be started from the third temperature $T_3$, and the fifth temperature $T_5$ is a glass transition temperature of the polymer material 400a. The third viscosity $V_3$ and the fifth viscosity $V_5$ are threshold values. As shown in FIG. 4A, the third viscosity $V_3$ is a minimum threshold value, and the fifth viscosity $V_5$ is a maximum threshold value. The second temperature $T_2$ is one of the selected operation temperatures, so that the second viscosity $V_2$ is close to the third viscosity $V_3$. The fourth temperature $T_4$ is another one of the selected operation temperatures. The fourth temperature $T_4$ is between the third temperature $T_3$ and the fifth temperature $T_5$, so that the fourth viscosity $V_4$ is between the third viscosity $V_3$ and the fifth viscosity $V_5$.

Based on the selected polymer material and the viscosity-temperature variation characteristic as shown in FIG. 4A, the preparation thickness h1 can be optionally selected from the range from 2 μm to 7 μm, such as 2 μm, 3 μm, 5 μm, 6 μm, 6.5 μm, or 7 μm.

To be noted, although the polymer material 400a has different viscosities at different temperatures, it is inherently the same material. The difference viscosities are caused by the variations of the bonding forces between the polymer molecules at different temperatures. As shown in FIGS. 3A to 3E, the polymer material 400a has the bonding force at room temperature, the polymer material 400b has the bonding force at the second temperature $T_2$, and the polymer material 400c has the bonding force at the fourth temperature $T_4$. Finally, the polymer material is solidified or cured to reach the stable bonds between the polymer molecules, thereby forming the connection layer 400 as shown in FIG. 1. To be noted, the connection layer 400 can be fabricated by the manufacturing method of this disclosure or any equivalent manufacturing method.

In this embodiment, one unit of the conductive pads 120 comprises a pair of conductive pads 120 for an example, which can be applied to the dual-electrode components in the following embodiments, but this disclosure is not limited thereto. In this embodiment, for example, the polymer material 400a covers the conductive pads 120, but this disclosure is not limited thereto.

Figure 3C:
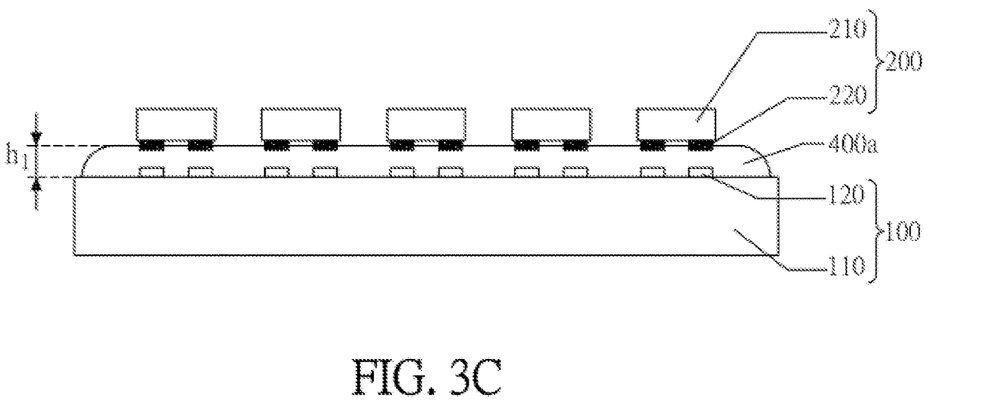

As shown in FIG. 3C, the step S20 is to provide an initial substrate (not shown) to contact the polymer material 400a coated on the target substrate 100, and to pick up all or a part of the micro semiconductor structures 200 in array through the initial substrate.

In this embodiment, the initial substrate can be a native substrate or a non-native substrate, and the entire or a part of the initial substrate is used to pick the micro semiconductor structures 200. Herein, the ratio of the initial substrate used to pick the micro semiconductor structures 200 is not the limited in this disclosure.

Besides the main body 210, each micro semiconductor structure 200 further comprises a conductive electrode 220 containing a second metal, and the conductive electrode 220 is disposed on the main body 210. In this embodiment, the micro semiconductor structure 200 is a dual-electrode structure, but this disclosure is not limited thereto.

The conductive electrodes 220 of each micro semiconductor structure 200 can be disposed corresponding to the conductive pads 120 on the pattern circuit of the target substrate 100 one on one. In this embodiment, the conductive electrodes 220 of each micro semiconductor structure 200 are connected to the conductive pads 120 of the target substrate 100 through the polymer material, but this disclosure is not limited thereto. For example, the main body 210 of each micro semiconductor structure 200 can be connected to the substrate 110 or the pattern circuit of the target substrate 100 through the polymer material, so that the conductive electrodes 220 can correspond to the conductive pads 120 one on one.

To be noted, the first metal of the conductive pad 120 and the second metal of the conductive electrode 220 have a eutectic temperature $T_m$. Referring to FIG. 4A, the eutectic temperatures can be different depending on the selected metal systems. In addition, the metal system must cooperate with the above-mentioned polymer material, so that the eutectic temperature $T_m$ can be controlled between the third temperature $T_3$ and the fourth temperature $T_4$ of the polymer material. In this embodiment, the first metal and the second metal are selected from the In—Au alloy system. That is, the first metal and the second metal comprise indium (In) and gold (Au), respectively, and vice versa. To make this embodiment more comprehensive, the amount of indium and gold can be optionally in a specific ratio so as to make the eutectic temperature $T_m$ remain at about 160° C. For example, the specific ratio of indium to gold can be optionally 2:1.

The step S30 is to eutectic bonding the conductive electrode 220 and the corresponding conductive pad 120. In this step S30, the micro semiconductor structures 200, the polymer material 400a, and the target substrate 200 are continuously heated to increase the temperature thereof from the first temperature $T_1$ to the fourth temperature $T_4$, and the following step S32 (FIG. 3D) and step S34 (FIG. 3E) are sequentially performed during the heating.

Figure 3D:
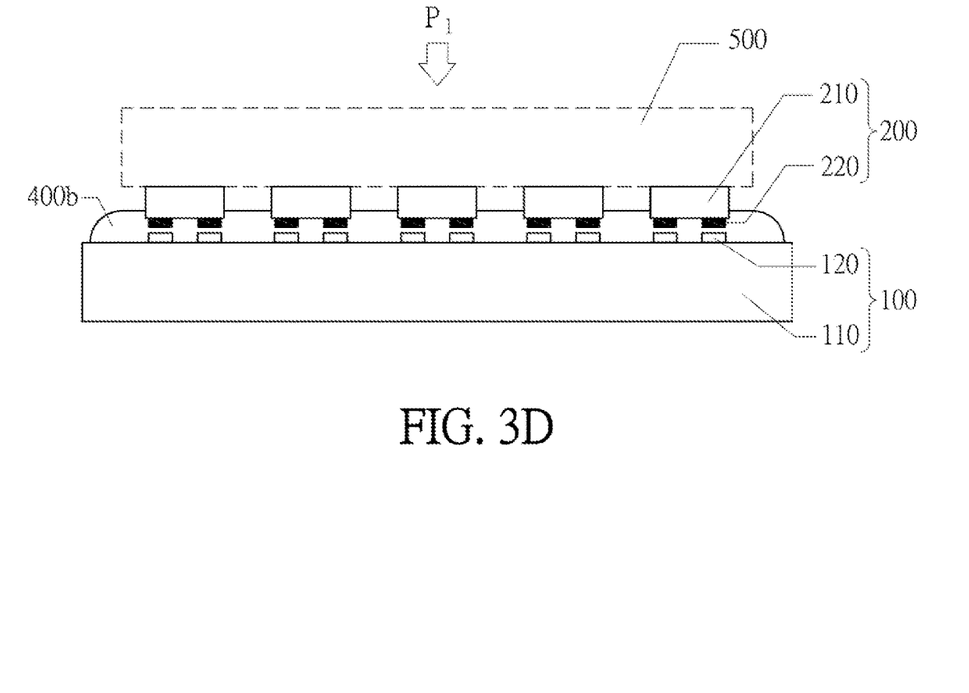
Figure 3E:
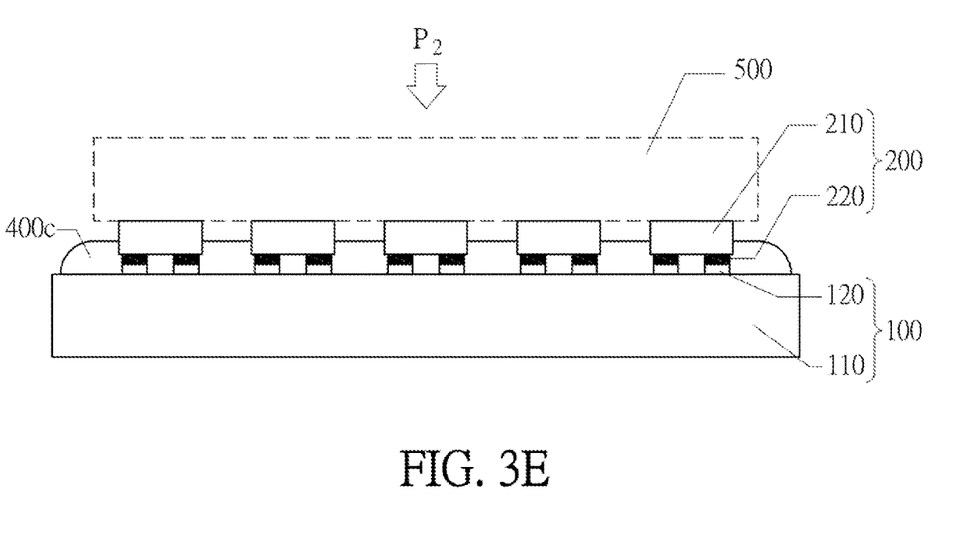

With reference to FIGS. 3D and 4A, the step S32 is to start, from the second temperature Tz, to approach the micro semiconductor structures 200 in array and the target substrate 100 to each other by a first pressure $P_1$. In this embodiment, the pressure (or force) can be applied to either one or both of the micro semiconductor structures 200 in array and the target substrate 100.

In this embodiment, for example, a pressing device 500 (indicated by dotted lines) is provided to apply the first pressure $P_1$ to the micro semiconductor structures 200 in array.

Since the step S32 is performed with continuously heating from the first temperature $T_1$, the polymer material 400a with the viscosity $V_1$ will become the polymer material 400b with the viscosity $V_2$ at the second temperature $V_2$, which has a higher fluidity. Afterwards, since the system is further continuously heated to the third temperature $T_3$ while approaching the micro semiconductor structures 200 in array toward the target substrate 100, the polymer material with much higher fluidity disposed between the conductive electrode 220 and the conductive pad 120 can have a higher chance of being discharged or until completely eliminated.

As shown in FIG. 4A, the polymer material has a relatively extremely small viscosity $V_3$ at the third temperature $T_3$, so that the polymer material has a relatively extremely high fluidity at the third temperature $T_3$. As a result, the third temperature $T_3$ can be assumed as the temperature to most easily discharge or eliminate the polymer material. To be noted, while the polymer material is heated over the third temperature $T_3$, the viscosity of the polymer material is decreased from the viscosity $V_3$. This disclosure consciously and optionally performs the step of approaching the conductive electrode 220 to the conductive pad 120 starting from the second temperature $T_2$ (before the third temperature $T_3$). This configuration can discharge or eliminate the polymer material earlier, thereby extending the period for discharging or eliminating the polymer material.

In this step, the first pressure $P_1$ can be continuously applied, and a first period of time is defined as the time period for applying the first pressure $P_1$ to approach the micro semiconductor structures 200 in array toward the target substrate 100. In other words, the first pressure $P_1$ is applied to discharge the polymer material between the conductive electrode 220 and the corresponding conductive pad 120, and the first time of period is the time length of the discharging procedure.

In this step, the first pressure $P_1$ can be continuously applied until the conductive electrode 220 contacting the conductive pad 120.

With reference to FIGS. 3E and 4A, the step S34 is to start, from the eutectic temperature $T_m$, to press the micro semiconductor structures 200 in array and the target substrate 100 to each other by a second pressure Pz. Since the fourth temperature $T_4$ is higher than the eutectic temperature $T_m$, when applying the second pressure $P_2$ to the micro semiconductor structures 200 and/or the target substrate 100, the first metal of the conductive pad 120 and the second metal of the conductive electrode 220 can melt with each other and generate eutectic bonding therebetween.

As mentioned above, the second pressure $P_2$ can be applied to either one or both of the micro semiconductor structures 200 in array and the target substrate 100.

In the embodiment, the first metal of the conductive pad 120 and the second metal of the conductive electrode 220 are eutectic bonded to form the connector 300 as shown in FIG. 1A, which is an integrated member. As the increasing of temperature, the polymer material 400c is continuously solidified (cured) to form the connection layer 400 as shown in FIG. 1, which can connect the micro semiconductor structures 200 (the main bodies 210) and the target substrate 100 (or the pattern circuit thereof).

Referring to FIG. 4A, the fourth temperature $T_4$ is the temperature of starting solidification (curing) of the polymer material. This disclosure consciously and optionally selects the eutectic temperature $T_m$ between the third temperature $T_3$ and the fourth temperature $T_4$. Before the solidification of the polymer material, the conductive electrode 220 is contact with the conductive pad 120 for generating the eutectic bonding therebetween. Afterwards, the temperature is increased so as to solidify (cure) the polymer material to form the connection layer 400 as shown in FIG. 1.

In this step, the second pressure $P_2$ can be continuously applied and a second period of time is defined as the time period for applying the second pressure $P_2$ to contact the micro semiconductor structures 200 in array with the target substrate 100.

Referring to FIG. 4A again, with respect to the In—Au alloy system (the first metal and the second metal), and the eutectic temperature $T_m$ thereof, the polymer material can be selected from, for example but not limited to, the epoxy materials or the acrylic materials. Accordingly, the fifth temperature $T_5$ (the glass transition temperature) of the selected polymer material is greater than 240° C., or is remained at about 260° C. Since the eutectic temperature $T_m$ is between the third temperature $T_3$ and the fourth temperature $T_4$, in the step S32, the polymer material between the conductive electrode 220 and the conductive pad 120 is discharged before the viscosity of the polymer material reaches the minimum value. That is, the polymer material between the conductive electrode 220 and the conductive pad 120 is discharged starting from the time point that the temperature reaches the second temperature $T_2$ (before the third temperature $T_3$). When the temperature increases to about the eutectic temperature $T_m$ and is not over the fifth temperature $T_5$ (the glass transition temperature), the conductive electrode 220 and the conductive pad 120 are press to contact with each other for generating the eutectic bonding. In other words, the eutectic temperature $T_m$ of the selected metal system is selected to be between the temperature $T_3$ (as the viscosity of the polymer material reaches the minimum value) and the fourth temperature $T_4$, the sub-steps S32 and S34 of the step S30 can fabricate the connectors 300 and the connection layer 400 into the one-layer structure as shown in FIG. 1.

To be noted, one of the methods for defining the polymer material is to select the alloy system with the first metal and the second metal, and the polymer material system in correspondence with the above-mentioned alloy system can be determined therefore, or vice versa. In the case of selecting the In—Au alloy system (the eutectic temperature $T_m$ is about 160° C.), the viscosity-temperature variation characteristic of the polymer material as shown in FIG. 4A is defined, and then the different temperature regions are defined as follow, wherein the fourth temperature $T_4$ of the polymer material is 170-220° C. (preferably 180-220° C.), the third temperature $T_3$ of the polymer material is 80-120° C. (preferably 100° C.), and the second temperature $T_2$ of the polymer material is 70-110° C. (preferably 90° C.).

Figure 4B:
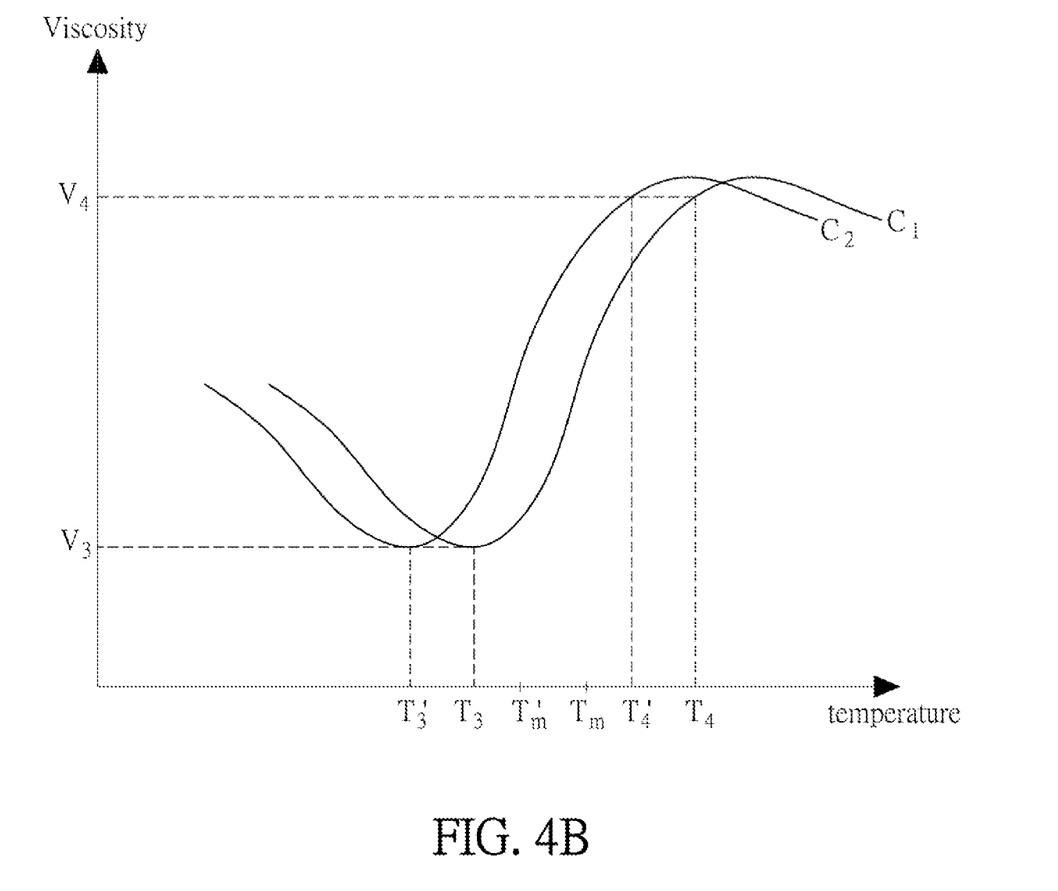
FIG. 4B is a schematic graph showing another viscosity-temperature variation characteristic.

Furthermore, in another method for defining the polymer material, which also selects the case of the In—Au alloy system (the eutectic temperature $T_m$ is about 160° C.), the viscosity-temperature variation characteristic of the polymer material as shown in FIG. 4A is correspondingly defined, and then the different temperature regions are defined as follow, wherein at least one of the fourth temperature $T_4$, the third temperature $T_3$ (with the minimum viscosity), and the eutectic temperature $T_m$ is determined and then the related temperatures can be found based on the following equations (relationships). Herein, the fourth temperature $T_4$ is relatively higher than the eutectic temperature $T_m$ for about 10-40° C., the fourth temperature $T_4$ is relatively higher than the third temperature $T_3$ for about 90-100° C., and the second temperature $T_2$ is relatively lower than the third temperature $T_3$ for about 10° C. As shown in FIG. 4B, a solid curve line $C_1$ represents the viscosity-temperature variation characteristic curve of FIG. 4A, and a dotted curve line $C_2$ represents a newly curve with a newly fourth temperature $T_4'$ decreased from $T_4$. The dotted curve line $C_2$ is similar to or identical to the solid curve line $C_1$, and can satisfy the definition for the regions as mentioned above, wherein the eutectic temperature $T_m$ (about 160° C.) is kept between a newly third temperature $T_3'$ and a newly fourth temperature $T_4'$. Optionally, a newly eutectic temperature $T_m$ of another eutectic metal system (e.g. lower than the eutectic temperature $T_m$) is allowed to be kept between the newly third temperature $T_3'$ and the newly fourth temperature $T_4'$.

In addition, in the manufacturing process of eutectic bonding, the first pressure $P_1$, the first period of time thereof, the second pressure $P_2$, and second period of time thereof can be optionally selected based on the requirements of the manufacturing process. For example, the first pressure $P_1$ can be optionally 1-10 MPa, and the first period of time lasts for 2-40 seconds. Preferably, the first pressure $P_1$ can be optionally 1-10 MPa, and the first period of time lasts for 2, 5, 10, 20, 30 or 40 seconds. For example, the second pressure $P_2$ can be optionally between 0.5 MPa and 50 MPa, and the second period of time lasts for 5-60 seconds. Preferably, the second pressure $P_2$ can be optionally between 0.5 MPa and 50 MPa, and the second period of time lasts for 5, 10, 20, 30, 40, 50 or 60 seconds.

To be noted, the first metal and the second metal can be optionally selected from the In—Ni alloy system. That is, the first metal and the second metal can be nickel (Ni) and indium (In), and vice versa. The amount of the indium and nickel can be in a specific ratio, so that the eutectic temperature $T_m$ can be roughly remained within 150-160° C. Of course, it can also be applied to the solid curve line $C_1$ as shown in FIG. 4B.

As mentioned above, in the electronic device 10 and the manufacturing method thereof of this disclosure, the adopted polymer material is a curable material without containing any conductive particles. Thus, the adopted polymer material is nonconductive. For further description, the adopted polymer material does not contain the conductive particles or conductive balls, which have high cost. Based on the manufacturing method, this disclosure can be widely applied to different electronic devices comprising micro semiconductor structures in different fields. This disclosure can also provide a solution for the electrical connection requirement of the micron-scaled or smaller micro semiconductor structures. Moreover, this disclosure can be further benefit of decreasing the manufacturing time and cost.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:
1. An electronic device, comprising:
a target substrate;
a micro semiconductor structure array comprising a plurality of micro semiconductor structures arranged in an array disposed on the target substrate;
a conductor array comprising a plurality of conductors arranged in an array, wherein the conductors are disposed corresponding to the micro semiconductor structures and electrically connecting the micro semiconductor structures to the target substrate, the conductors are independent and individual to one another, each of the conductors is an integrated member formed by eutectic bonding a conductive pad of the target substrate and a conductive electrode of a corresponding one of the micro semiconductor structures, and each of the conductors comprises a first end connecting to the corresponding micro semiconductor structure, a second end connecting to the target substrate, and a peripheral portion connecting to the first end and the second end; and
a connection layer connecting the micro semiconductor structures to the target substrate, wherein the connection layer is nonconductive, the connection layer contacts and surrounds the peripheral portion of each of the conductors, and the connection layer and the conductors together form a one-layer structure,
wherein the connection layer comprises a polymer material, the polymer material is defined with a viscosity-temperature variation characteristic, the polymer material has a first viscosity at a first temperature, a second viscosity at a second temperature, a third viscosity at a third temperature, a fourth viscosity at a fourth temperature, and a fifth viscosity at a fifth temperature, the first temperature to the fifth temperature are increased sequentially, the first temperature is a room temperature, the fifth temperature is a glass transition temperature of the polymer material, the third viscosity and the fifth viscosity are threshold values, the third viscosity is a minimum threshold value, the fifth viscosity is a maximum threshold value, the second viscosity is close to the third viscosity, the conductive pad comprises a first metal, the conductive electrode comprises a second metal, the first metal and the second metal have a eutectic temperature, the eutectic temperature is between the third temperature and the fourth temperature, the fourth temperature is the temperature of starting solidification of the polymer material.

2. The electronic device of claim 1, wherein each of the conductors is formed by a eutectic bonding of an In—Au alloy system.

3. The electronic device of claim 1, wherein each of the conductors is formed by a eutectic bonding of an In—Ni alloy system.

4. The electronic device of claim 1, wherein a polymer material of the connection layer comprises an epoxy material, or an acrylic material.

5. The electronic device of claim 1, wherein the polymer material of the connection layer has a solidification temperature of 170-220° C.

6. The electronic device of claim 1, wherein the glass transition temperature is greater than 240° C.

* * * * *